Jan. 30, 1962 H. DA COSTA 3,019,010

LEVELING APPARATUS

Filed Feb. 23, 1960 2 Sheets-Sheet 1

INVENTOR.
Harry da Costa,
BY Mueller & Aichele
Atty's.

Jan. 30, 1962 H. DA COSTA 3,019,010

LEVELING APPARATUS

Filed Feb. 23, 1960 2 Sheets-Sheet 2

INVENTOR.
Harry da Costa,
BY
Mueller & Aichele
Attys.

United States Patent Office 3,019,010

Patented Jan. 30, 1962

3,019,010

LEVELING APPARATUS

Harry Da Costa, Phoenix, Ariz., assignor to Motorola, Inc., Chicago, Ill., a corporation of Illinois Filed Feb. 23, 1960, Ser. No. 10,439
5 Claims. (Cl. 269—191)

This invention relates generally to a device for positioning a minature workpiece by rotating it to a position in which a surface of the workpiece on which work is to be performed has an exact angular orientation with respect to a tool. More particularly, the invention is directed to a leveling jig for use in the manufacture of semiconductor devices, the jig being adapted to support an assembly of the semiconductor device adjacent a nozzle of an etching head and being adjustable so as to position a surface of a semiconductor unit included in the assembly parallel to the end of the nozzle.

The leveling jig or device of the present invention has been applied advantageously in the manufacture of semiconductor devices of very small size, although its usefulness is not restricted to this field. In fabricating certain high frequency transistors, which are exceptionally tiny semiconductor devices, a microminiature semiconductor body for the transistor is etched so as to form a projection on its surface surrounded by an etched area. A special etching head has been provided which makes it posible to accomplish the etching without applying masses of resist material to the semiconductor body, and the elimination of resist materials from the etching process is very advantageous, primarily because they tend to contaminate the semiconductor unit and thereby shorten the useful life of the transistor. The etching head is a multiple nozzle device which applies obturating gas to a selected area of the surface where the projection is to be formed, and applies etching liquid called electrolyte to an area surrounding the selected area. The gas and liquid issue from the etching head in the form of a composite jet. The gas protects the central region so that it is not etched, and current which is passed through the liquid causes it to etch material away from the surrounding area.

In order to form the etched and unetched areas with the desired size and configuration, it is necessary that the surface of the semiconductor body which is to be etched be parallel to the end of the nozzle structure of the etching head. The process of positioning the assembly including the semiconductor unit so that the surface to be etched and the end of the etching nozzle will be parallel during the etching operation is called a leveling process, and the apparatus of the invention which provides this positioning is called a leveling device or jig.

It is one general object of the present invention to provide a leveling device which provides precise angular positioning of a workpiece so that it has a predetermined angular relation with the operating position of a tool which performs certain work on the workpiece.

A more specific object of the invention is to provide a device for supporting an assembly including a semiconductor unit in position to be etched by a composite jet of gas and etching liquid supplied from an etching head, and which provides fast and simple adjustments for controlling and setting the angular relation between the surface to be etched and the nozzle structure of the etching head.

Another object of the invention is to provide a simple construction for a device for holding a miniature workpiece and for adjusting the angular position of the workpiece such that the device itself can be fabricated economically and requires a minimum of maintenance.

A feature of the invention is the provision of a leveling device which includes a support and a movable carrier on the support having a mounting portion for receiving a workpiece, with a universal-type joint between the carrier and the support constructed such that the carrier supports the workpiece at a substantially fixed height and can be adjusted to rotate the workpiece angularly at that height for altering and setting the angular position of the workpiece.

Another feature of the invention is the provision of a leveling device including a stand with an annular bearing portion, and a movable carrier having a conical surface seated on the annular bearing, with the conical and annular shapes forming a special universal joint which provides precise leveling of a workpiece mounted on the carrier upon rotary adjustment of the carrier, and which is comparatively simple and economical to manufacture.

The invention is illustrated in the accompanying drawings in which.

Figures 1, 2, 3, 4:
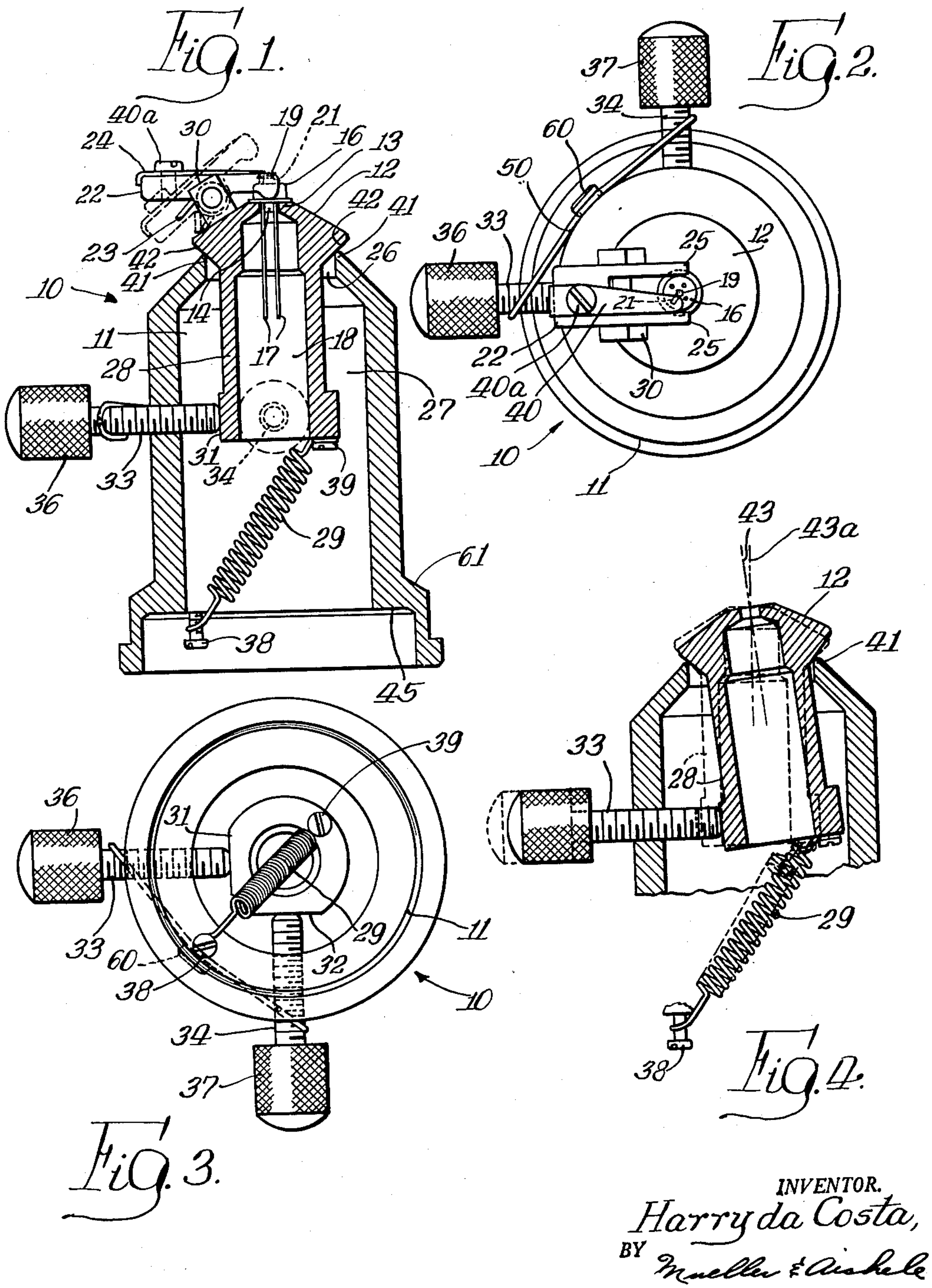
FIG. 1 is a longitudinal section of a leveling device in accordance with the invention, and shows a transistor assembly which is supported and positioned by the leveling device.
FIG. 2 is a top plan view of the leveling device of FIG. 1.
FIG. 3 is a bottom plan view of the leveling device and shows in particular the relation of the adjusting controls to the carrier structure included in the device.
FIG. 4 is a fragmentary sectional view showing the carrier structure of the leveling device in different positions in order to illustrate the operation of the device.

The leveling device of the invention is a comparatively simple structure which can be manufactured quite economically, and yet it provides extremely precise adjustments for controlling and setting the angular position of a workpiece such as the tiny semiconductor unit which is provided in high frequency transistors. The leveling device includes a hollow stand or support structure which has a circular bearing portion forming an annular socket. A carrier structure is movably seated on this socket and preferably has a conical surface which together with the bearing portion of the stand provides a special kind of universal joint. The carrier structure has a mounting portion which is adapted to support the transistor subassembly or other workpiece at the center of rotation of the carrier such that the height of the workpiece does not change substantially with respect to a reference level as the carrier is adjusted. The carrier has an extension located within the hollow stand, and a pair of adjusting screws engage this extension and are angularly spaced apart approximately 90° with respect to the extension for rotating the carrier in any direction except about the axis of the conical surface. The carrier is urged against the adjusting screws such as by a spring, and a suitable clip device may be provided to hold the transistor assembly in place on the mounting portion of the carrier.

The construction of the leveling device will be described primarily with reference to FIGS. 1 to 5 inclusive. The leveling device 10 includes a hollow stand 11 which has a generally tubular shape and a hollow carrier 12 which is rotatably supported by the stand 11. The carrier 12 has a mounting portion 13 at its upper end, and there is an opening 14 extending through this mounting portion. A transistor assembly 16, known as a header assembly, is received on the mounting portion 13 of the carrier, and the connector leads 17 of the assembly 16 extend through the opening 14 into the hollow interior 18 of the carrier 12. The upper surface of the mounting portion 13 of the carrier 12 is flattened so that it provides a stable seat for the header assembly 16.

Figures 5, 6, 7, 8, 9:
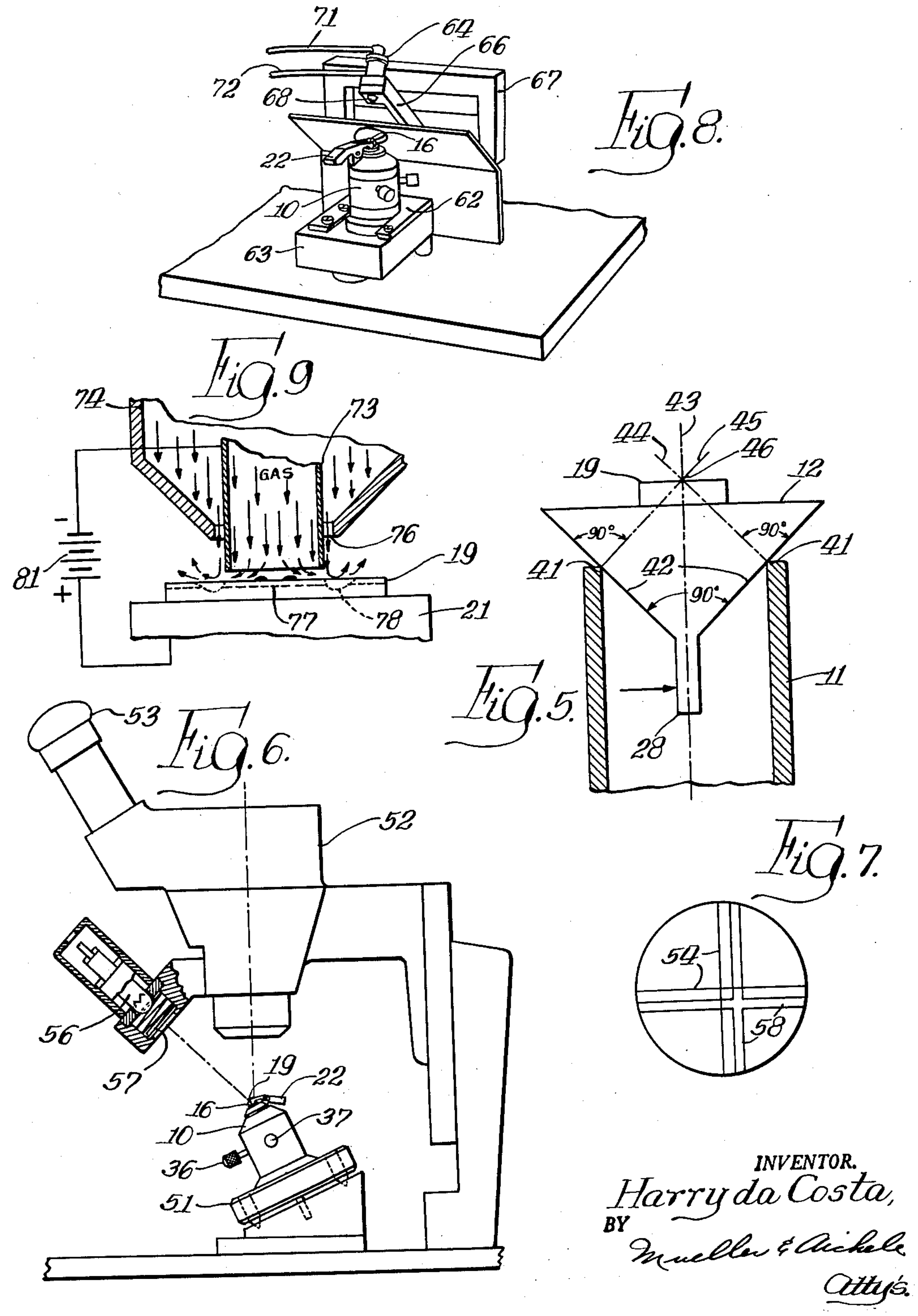
FIG. 5 is a schematic diagram which illustrates the structural principles of the leveling device.
FIG. 6 shows the leveling device of FIGS. 1–4 mounted under a microscope provided with a light reflecting system, and this optical apparatus is useful in determining when the semiconductor unit of the transistor assembly mounted on the leveling device has been properly positioned.
FIG. 7 shows schematically a pair of crosses which can be seen through the microscope of FIG. 6 when the semiconductor unit is being leveled, and which become aligned when the semiconductor unit is adjusted to the proper position by adjustment of the leveling device.
FIG. 8 is a view of part of an etching machine, and shows in particular an etching head in a raised position over the transistor assembly supported on the leveling device.
FIG. 9 is a schematic view showing the nozzle portion of the etching head of FIG. 8 and its relation to the semiconductor unit of the transistor assembly at the time the etching takes place.

The assembly 16 includes a semiconductor unit 19 which is so small that it is not visible in FIG. 1, but it is shown greatly enlarged in FIG. 9. The semiconductor unit 19 is attached to a heat sink tab 21 which is secured to the upper end of one of the leads 17. In the manufacture of transistor devices as described herein, the semiconductor unit 19 is the workpiece which is supported and leveled by the leveling device 10.

A spring biased clip device 22 holds the header assembly 16 firmly in place on the mounting portion 13 so that it does not shift about with respect to the carrier. The clip 22 is biased to the position shown with solid lines in FIG. 1 by a spring 23, and the clip can be pivoted to the raised position shown with dotted lines in FIG. 1 by depressing the end 24 of the clip. The clip 22 includes two arms 25 pivotally supported on a bracket 30 secured to the carrier 12. The arms 25 are spaced to clear the body of the header assembly 16 and engage a flange at the bottom of the body which seats on the flat surface of the mounting portion 13. A metal finger 40 engages and makes electrical contact with the tab 21, and an electrical terminal post **40*a*** in the form of a screw is provided to receive an electrical connector so that electrical potential can be supplied to the semiconductor unit as will be described in connection with FIG. 9 later.

The carrier 12 extends from outside the stand 11 through an opening 26 at the upper end of the stand into the hollow interior 27 of the stand. The tubular part 28 of the carrier within the stand 11 is the actuating or control portion. The lower end of the actuating portion 28 is slightly enlarged and has two flat surfaces 31 and 32 spaced at a 90° angle with respect to the longitudinal axis of the carrier 12 (see FIG. 3). The flat surfaces 31 and 32 are engaged by the ends of two adjusting screws 33 and 34 which have knurled knobs 36 and 37 on their outer ends to facilitate turning them. The screws 33 and 34 extend through threaded openings in the wall of the stand 11, and the threaded openings provide axial movement of the screws when they are rotated. The axial movement of the adjusting screws causes the carrier 12 to rotate, and the screws may be adjusted to move the carrier in any rotary direction except about its own axis. The carrier 12 is biased against the ends of the screws 33 by a spring 29, and thus the actuating portion 28 of the carrier follows the axial movement of the screws 33. The spring 29 is connected at one end to the stand 11 by a screw 38 and is connected to the actuating portion 28 of the carrier by another screw 39. The spring 29 extends at an angle such that it urges the carrier against both screws and also pulls it down onto the stand 11, and thus the carrier is held firmly at whatever position it has been adjusted to by the screws 33 and 34. A spring wire 50 secured to the stand by a screw 60 has its ends looped about the screws 33 and 34, and this applies pressure to the adjusting screws which holds them in order to prevent accidental turning of the screws after the device 10 has been adjusted.

The carrier can be set in any desired angular position, and this controls and sets the angular position of the semiconductor unit 19 included in the assembly 16.

The joint between the carrier 12 and the stand 11 is constructed such that the height of the semiconductor work-piece 19 does not change to any significant extent between the extremes of movement of the carrier 12. This joint is generally of the universal type, but it has a special configuration which is comparatively easy to fabricate as will be apparent. The carrier 12 is seated on a circular bearing portion 41 at the upper end of the stand 11, and the bearing portion 41 has a sharp edge. Thus, the bearing portion forms an annular socket. The carrier 12 has a conical surface 42 in slidable contact with the bearing portion 41 of the stand, and the conical surface 42 and the annular bearing portion 41 constitute a universal joint which provides rotary movement of the carrier in every direction. However, the carrier 12 is held against rotary movement about its own axis by the adjustment screws 33 and 34 as previously mentioned.

The mounting portion 13 of the carrier is located on the central axis of the conical surface 42, and the specific height of the top surface of the mounting portion 13 is selected such that the semiconductor unit 19 is positioned at the center of rotation of the carrier 12. Since the semiconductor unit 19, which is the workpiece, is located at this center of rotation, its height with respect to the stand 11, or some other suitable reference point, does not vary when its angular position is changed by adjusting the screws 33 and 34. This makes the leveling device compatible with an optical system for viewing the angular position of the workpiece as will be explained more fully in connection with FIG. 6.

The geometrical principles of the joint between the carrier 12 and the stand 11 are illustrated by the schematic drawing of FIG. 5. In FIG. 5, the stand 11 with the annular bearing portion 41 is represented by a tube, and the carrier 12 is represented by a conical body having an actuating extension 28 at its apex. The workpiece 19, which actually is the semiconductor unit included in the header assembly 16, is represented by a block.

The conical surface 42 forms an angle at its apex of 90°, and thus the surface 42 has the shape of a right circular cone. With the conical body 12 in the position illustrated in FIG. 5 wherein the axis of the cone coincides with the axis of the tube 11, the center of rotation of the carrier 12 is easily located by the two construction lines 44 and 45 which are perpendicular to the conical surface 42 and extend through the points of engagement between the surface 42 and the bearing portion 41. The construction lines 44 and 45 intersect at a point 46 on the axis 43 of the cone, and this point 46 is the center of rotation of the carrier 12. The position of the point 26 does not change upon rotation of the body 12, and therefore with the surface of the workpiece 19 on which work is to be performed supported at the point 46 as illustrated in FIG. 5, the angular position of this surface can be adjusted without changing the position of the center of the work area.

The motion of the working parts of the leveling device can be visualized from the schematic illustration of FIG. 4. The centered position of the carrier 12 and the corresponding position of the adjusting screw 33 are represented by broken lines in FIG. 4. When the screw 33 is turned so that it moves axially toward the carrier 12 to the position represented by solid lines, it pushes the actuating portion 28 of the carrier to the right as viewed in FIG. 4, and this rotates the carrier to the position represented by solid lines. In this position, the axis 43 of the conical surface of the carrier forms an acute angle with the axis **43*a* of the annular bearing portion 41, and in any position of the carrier the angle between the axes 43 and 43*a* defines the relation of the carrier to the stand. The adjusting screws 33 and 34 in cooperation with the biasing spring 29 hold the carrier 12** in the selected position to which it is moved.

In order to determine when the semiconductor unit 19 of the assembly 16 is in the proper angular position for subsequent processing, an optical system as illustrated in FIGS. 6 and 7 can be employed advantageously. The leveling device 10 with a header assembly 16 held in place by the clip 22 is mounted on a cradle 51 in a position such that the semiconductor unit 19 of the transistor assembly is in the optical field of the microscope 52. The stand has ain internal shoulder 45 at its bottom (see FIG. 1) which fits on the cradle 51. The microscope has cross-hairs provided in the lens system, and when an operator looks through the eyepiece 53 a cross is visible which has the appearance represented by the crossed lines 54 in FIG. 7. The microscope is provided with a light reflecting system including a light source 56 and a diffusing element 57 of ground glass or other suitable diffusing material. Most of the plate 57 is opaque, but it has an area in the form of a cross which transmits light from the source 57 such that a cross of diffused light shines on the workpiece 19. Some of the light is reflected by the semiconductor unit into the optical system of the microscope 52 as indicated by the broken lines in FIG. 6. When an operator looks through the microscope, a cross of light represented by the crossed double lines 58 in FIG. 7 is visible. The opitcs of the optical system are arranged such that when the light cross 58 is centered or aligned with the reference cross 54, the semiconductor unit of the assembly 16 is in the desired position for subsequent processing. When the light cross 58 is offset from the reference cross 54 as shown in FIG. 7, the adusting knobs 36 and 37 of the leveling device 10 are turned to change the angular position of the workpiece, and this causes the light cross 58 to move. The correct position of the workpiece is obtained by adjusting the knobs 36 and 37 until the two crosses 54 and 58 become aligned.

The leveling device 10 is then removed from the optical system and is put into an etching machine which is illustrated partially in FIG. 8. The external shoulder 61 of the stand 11 (see FIG. 1) fits under a plate 62 which has a U-shaped opening for receiving and holding the leveling device 10 in position on a pedestal 63. The leveling device 10 is supported in a position such that the transistor assembly 16 which includes the semiconductor unit or workpiece 19 is located directly under an etching head 64. The etching head is mounted on a pivotal carrier arm 66 which is supported on a frame 67 secured to a positioning mechanism which is not shown. The etching head 64 and the arm 66 are shown in a raised position in FIG. 8, and the positioning mechanism operates to lower the arm and the etching head so that the nozzle portion 68 of the head is directly over and closely spaced from the surface of the semiconductor unit which is to be etched. The etching head 64 applies both gas and liquid electrolyte to the semiconductor unit 19. The gas is supplied through a hose 71 and the electrolyte is supplied through another hose 72.

The manner in which etching takes place and the relation of the semiconductor unit 19 to the nozzle structure of the etching head are illustrated schematically in FIG. 9. The etching head 64 is a multiple-nozzle device which includes an inner nozzle in the form of a tube 73 and an outer nozzle provided by another tube 74. The etching liquid or electrolyte flows through the space between the tubes 73 and 74, and obturating gas flows through the center of the tube 73. The end of the inner tube or nozzle 73 is held in a position closely spaced from the upper surface of the semiconductor unit 19, and it has been found that a suitable spacing is about one ten thousands of an inch. The electrolyte flows through a nozzle orifice 76 between the end of the outer tube 74 and the wall of the inner tube 73, and this electrolyte is directed onto the peripheral area of the semiconductor unit 19 which is to be etched, as indicated by the arrows.

The gas flows outwardly from the bottom of the inner nozzle or tube 73, and forces the electrolyte outwardly away from the central region 77 of the semiconductor unit. Electrical potential supplied from a suitable source, which is represented by the battery 81 in FIG. 9, is applied to the etching head and to the semiconductor unit 19, and the etching head is made electrically negative with respect to the semiconductor unit. This causes the material of the semiconductor unit that is contacted by the electrolyte to be etched away as indicated by the curved dotted lines 78 in FIG. 9. The etching is continued only long enough to remove material from the body 19 to a selected depth, and the result is that a channel-like depression or moat 78 is etched into the unit 19 and surrounds an unetched projection 77.

Although the specific purposes and effects of forming this particular etched configuration will not be elaborated since this is not necessary for a full understanding of the present invention, it may be noted that the central projection 77 formed by the etching is the active area of the transistor being considered, and it is necessary to control the size and configuration of this projection very accurately. It is for this reason that it is necessary to have the upper surface of the semiconductor body 19 precisely parallel to the end of the nozzle 73. It may be seen that if the surface of the body 19 were tilted with respect to the end of the tube 73, the gas would not flow uniformly around the end of the tube, and this would cause the configuration of the depression 78 and also that of the projection 77 to be distorted. By adjusting the angular position of the body 19 in the leveling device 10 of the invention, the position of the body 19 can be controlled and set very precisely so that it will be parallel to the end of the etching head when it is etched as illustrated in FIG. 9.

It is apparent from the foregoing description that the leveling device or jig of the invention provides precise positioning of a workpiece, and yet it has a relatively simple and straightforward construction. The provision of the cone-and-annulus joint between the carrier and the stand of the leveling device facilitates construction of the device since these shapes can be formed and machined comparatively easily and economically. The device can be adjusted quickly by a relatively unskilled operator, and this helps to speed up the manufacture of products such as the transistor described herein.

I claim:

1. A device for supporting a workpiece and for adjusting the angular position of the workpiece, including in combination, a stand having a hollow portion and a circular bearing portion forming an opening leading to said hollow portion of said stand, a carrier rotatably supported on said circular bearing portion, said carrier having a mounting portion located outside said hollow portion of said stand and having an actuator portion located within said hollow portion of said stand, a conical surface on said carrier in sliding contact with said bearing portion of said stand for permitting rotary movement of said carrier to different angular positions with respect to said stand, said mounting portion of said carrier being located centrally of said conical surface and being adapted to support a workpiece with a surface thereof at the center of rotation of said carrier so that said surface moves only angularly with respect to said stand upon the aforesaid rotary movement of said carrier, a pair of adjustment screws engaging said actuator portion of said carrier and having portions outside said stand for manual actuation, said adjustment screws being spaced at a substantially 90° angle with respect to said actuator portion of said carrier for providing rotary movement of said carrier to different angular positions with respect to said stand, and means biasing said actuator portion against said adjustment screws.

2. A device for supporting an assembly for a semiconductor device including a semiconductor unit and for adjusting the angular position of the semiconductor unit, including in combination, a stand having a hollow portion and a circular bearing portion forming an opening leading to said hollow portion of said stand, a tubular carrier rotatably supported on said circular bearing portion, said carrier having a mounting portion located outside said hollow portion of said stand and having an actuator portion located within said hollow portion of said stand, a conical surface on said carrier in sliding contact with said bearing portion of said stand for permitting rotary movement of said carrier to different angular positions with respect to said stand, said mounting portion of said carrier being located centrally of said conical surface and being adapted to receive and support the aforesaid assembly partially within said tubular carrier and with a surface of said semiconductor unit at the center of rotation of said carrier so that said surface moves only angularly with respect to said stand upon the aforesaid rotary movement of said carrier, a pair of adjustment screws engaging said actuator portion of said carrier and having portions outside said stand for manual actuation, said adjustment screws being spaced at a substantially 90° angle with respect to said actuator portion of said carrier for providing rotary movement of said carrier to different angular positions with respect to said stand, and means biasing said actuator portion against said adjustment screws.

3. A device for supporting an assembly for a semiconductor device including a semiconductor unit and for adjusting the angular position of the semiconductor unit, including in combination, a stand having a hollow portion and a circular bearing portion forming an opening leading to said hollow portion of said stand, a carrier rotatably supported on said circular bearing portion, said carrier having a mounting portion located outside said hollow portion of said stand and having an actuator portion located within said hollow portion of said stand, a conical surface on said carrier in sliding contact with said bearing portion of said stand for permitting rotary movement of said carrier to different angular positions with respect to said stand, said carrier having a center of rotation which remains in substantially fixed position with respect to said stand upon the aforesaid rotary movement of said carrier, said mounting portion of said carrier being located centrally of said conical surface and being adapted to receive and support the aforesaid assembly with a part of said semiconductor unit at the center of rotation of said carrier, means for holding the assembly in place on said mounting portion, a pair of adjustment screws engaging said actuator portion of said carrier and having portions outside said stand for manual actuation, said adjustment screws being spaced at a substantially 90° angle with respect to said actuator portion of said carrier for providing rotary movement of said carrier to different angular positions with respect to said stand, and means biasing said actuator portion against said adjustment screws.

4. In a work holding device having a carrier which is adjustable on an annular socket so that a workpiece may be mounted on the carrier and established in a desired angular position by adjustment of the carrier, the combination with said carrier and socket of a conical pivot portion forming a part of said carrier, which pivot portion has a surface in the form of a section of a right angular cone fitting with said annular socket and permitting tilting movement of said carrier about a predetermined center of rotation upon adjustment thereof, and means forming a mounting portion on said carrier adjacent said center of rotation thereof for retaining and positioning a workpiece with a surface portion thereof at said center of rotation, such that a surface portion of such workpiece when mounted on said carrier moves only angularly upon tilting adjustment of said carrier.

5. A portable device for holding and positioning a semiconductor assembly which includes a semiconductor unit mounted on a base and lead members projecting from said base, with the device being adapted to establish the semiconductor unit in a desired angular position, said device including in combination a stand having a hollow portion and a circular bearing portion forming an opening leading to said hollow portion, a carrier having a generally tubular mounting portion located outside said hollow portion of said stand and having an actuator portion located within said hollow portion of said stand, said carrier further having a surface of circular section fitting with said socket which surface tapers inwardly with respect to said socket and forms therewith a universal-type joint between said carrier and said stand so that said carrier is tiltable about a predetermined point located adjacent said mounting portion, said mounting portion of said carrier being located centrally of said circular bearing portion and adapted to receive and support said semiconductor assembly with said lead members thereof projecting into said mounting portion and with a surface of said semiconductor unit positioned at said pivot point so that said semiconductor surface moves only angularly upon tilting adjustment of said carrier, and a pair of adjustment members coupled to said actuating portion of said carrier within said hollow portion of said stand and having portions outside said stand for manual actuation, said adjustment members being spaced at a 90° angle with respect to said actuator portion of said carrier for providing tilting movement of said carrier in order to adjust the angular position of a workpiece with respect to said stand.

References Cited in the file of this patent

UNITED STATES PATENTS

| | | |
|---|---|---|
| 2,684,855 | Wales et al. | July 27, 1954 |

FOREIGN PATENTS

| | | |
|---|---|---|
| 883,081 | Germany | July 13, 1953 |
| 718,651 | Great Britain | Nov. 17, 1954 |